US007626213B2

(12) United States Patent
Lin

(10) Patent No.: US 7,626,213 B2
(45) Date of Patent: Dec. 1, 2009

(54) LIGHT-EMITTING DIODE LAMP

(76) Inventor: Chien-Feng Lin, No. 14, Lane 9, Ankang Street, Hsinchu City (TW)

( * ) Notice: Subject to any disclaimer, the term of this patent is extended or adjusted under 35 U.S.C. 154(b) by 136 days.

(21) Appl. No.: 12/055,017

(22) Filed: Mar. 25, 2008

(65) Prior Publication Data

US 2009/0242922 A1 Oct. 1, 2009

(51) Int. Cl.
*H01L 23/34* (2006.01)

(52) U.S. Cl. ......................... 257/99; 257/706; 257/712; 257/E31.105; 257/E33.056; 362/294; 362/373

(58) Field of Classification Search ................... 257/99, 257/706, 712, E33.056, E33.058, E31.105
See application file for complete search history.

(56) References Cited

U.S. PATENT DOCUMENTS 7,438,448 B2 * 10/2008 Chen .......................... 362/373
2007/0132092 A1 * 6/2007 Hu et al. ..................... 257/712
2009/0046464 A1 * 2/2009 Liu et al. .................... 362/294
2009/0135604 A1 * 5/2009 Chen .......................... 362/294
2009/0147518 A1 * 6/2009 Shuai et al. ............ 362/249.02

* cited by examiner

*Primary Examiner*—Fernando L Toledo
(74) *Attorney, Agent, or Firm*—WPAT, P.C.; Anthony King

(57) ABSTRACT

A light-emitting diode (LED) lamp includes a columnar body having a plurality of heat-radiating fins, an LED supporting end, and a mounting end; a first conducting plate disposed on the LED supporting end; an LED having a first electrode in electric contact with the first conducting plate; a second conducting plate in electric contact with a second electrode of the LED; a cap having a rear coupling end covered around the LED supporting end of the columnar body and a front end defining a central opening to enclose a light-emitting section of the LED therein; a first annular gasket disposed between the rear coupling end of the cap and the LED supporting end of the columnar body; and a second annular gasket disposed between the light-emitting section and the central opening of the cap. Therefore, the LED lamp is waterproof and easy to maintain, and allows good heat radiation.

6 Claims, 5 Drawing Sheets

LIGHT-EMITTING DIODE LAMP

FIELD OF THE INVENTION

The present invention relates to a light-emitting diode (LED) lamp, and more particularly to a waterproof LED lamp with good heat-radiating effect.

BACKGROUND OF THE INVENTION

Lamps are frequently needed and used in people's daily life as an aid to see clearly, particularly in the dark. A most common conventional lamp includes a bulb mounted on a lamp base, so that electric power is supplied to the bulb via the lamp base for the bulb to emit light. The conventional lamp does not include any heat-radiating structure. Therefore, a large amount of heat would be produced by the lamp and accumulate when the lamp is lighted over a long period of time. The accumulated heat inevitably shortens the usable life of the conventional lamp. Further, the conventional lamp does not include any waterproof structure and tends to become short-circuited when being splashed with water.

Therefore, it is tried by the inventor to develop a lamp that is waterproof and has good heat radiating effect.

SUMMARY OF THE INVENTION

A primary object of the present invention is to provide a waterproof LED lamp.

Another object of the present invention is to provide an LED lamp with good heat-radiating effect.

A further object of the present invention is to provide an LED lamp that is easy to maintain or replace.

To achieve the above and other objects, the LED lamp according to the present invention includes a columnar body, a first conducting plate, and LED, a second conducting plate, a cap, a first annular gasket, and a second annular gasket. The columnar body has an LED supporting end, a mounting end, a plurality of heat-radiating fins spaced along an outer circumferential surface of the columnar body to extend between the LED supporting end and the mounting end, and a first and a second through hole communicating the LED supporting end with the mounting end. The first conducting plate is disposed on the LED supporting end of the columnar body. The LED has a first electrode in electric contact with the first conducting plate. The second conducting plate is in electric contact with a second electrode of the LED. The cap has a rear coupling end covered around the LED supporting end of the columnar body and a front end defining a central opening to enclose a light-emitting section of the LED therein. The first annular gasket is disposed between the rear coupling end of the cap and the LED supporting end of the columnar body, and the second annular gasket is disposed between the light-emitting section of the LED and the central opening of the cap.

The columnar body may be a cylindrical columnar body, and the heat-radiating fins are curved in shape to provide increased heat radiating area. And, the mounting end of the columnar body is externally provided with male threads to facilitate easy mounting or dismounting of the LED lamp to or from a lamp base.

Therefore, with the provision of the annular gaskets, the curved heat-radiating fins, and the external male threads, the LED lamp of the present invention is waterproof and easy to maintain, and allows good heat radiation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
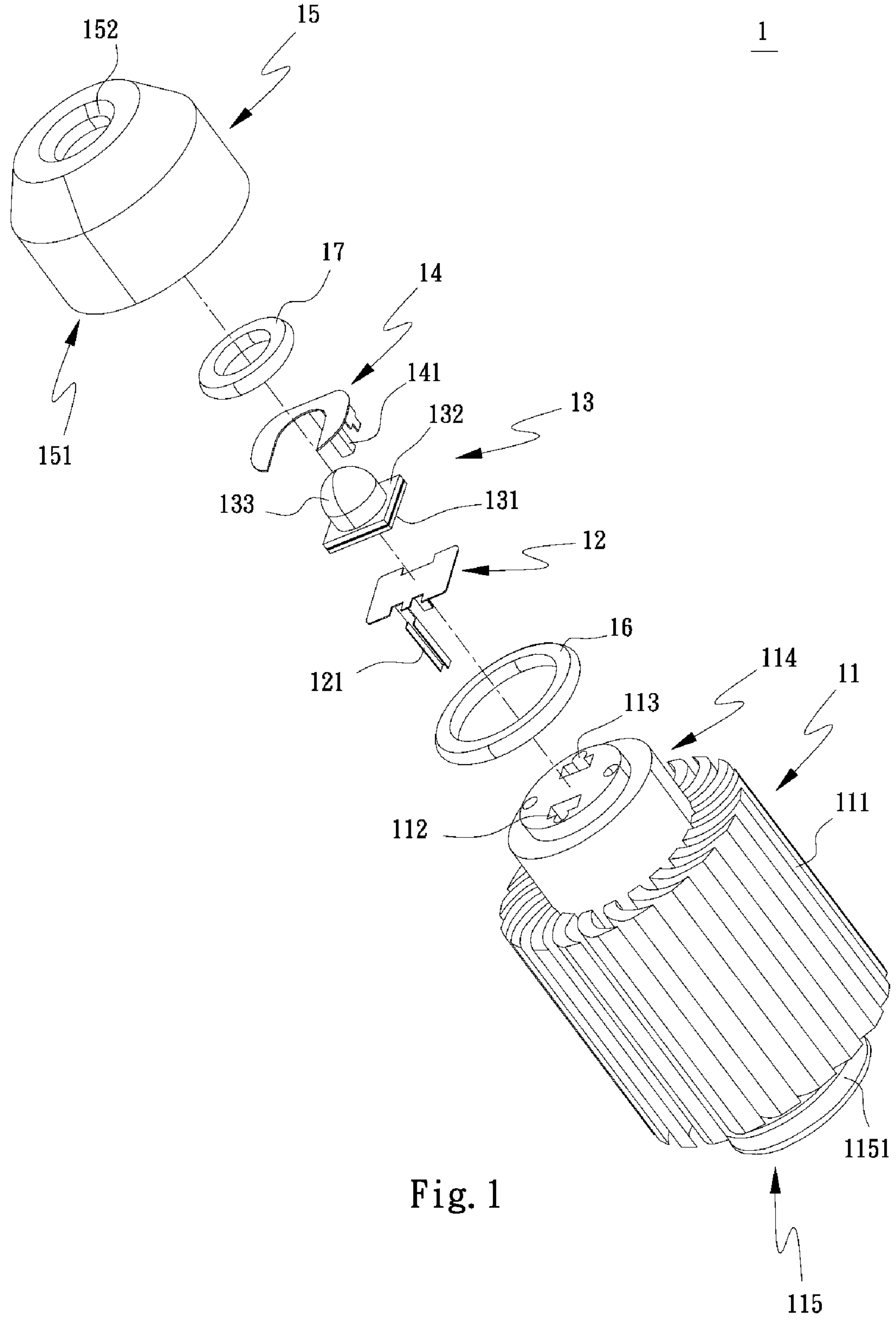
FIG. 1 is an exploded perspective view of a light-emitting diode (LED) lamp according to a preferred embodiment of the present invention.
Figure 2:
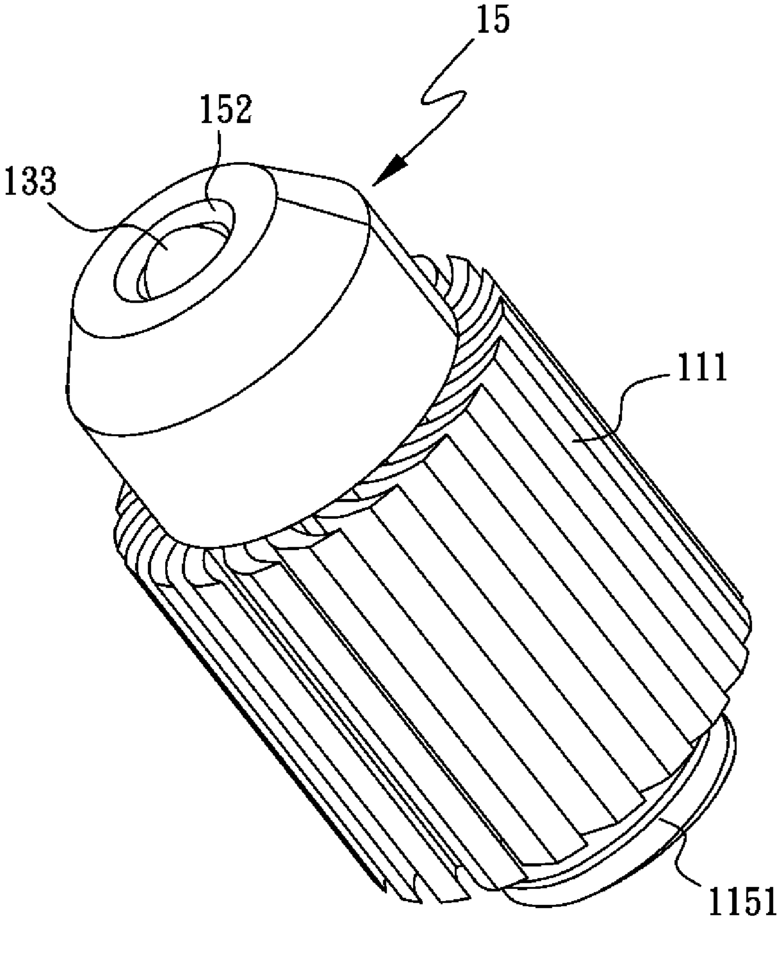
FIG. 2 is an assembled view of FIG. 1.

Please refer to FIGS. 1 and 2 that are exploded and assembled perspective views, respectively, of a light-emitting diode (LED) lamp 1 according to a preferred embodiment of the present invention. As shown, the LED lamp 1 includes a columnar body 11, a first conducting plate 12, an LED 13, a second conducting plate 14, a cap 15, a first annular gasket 16, and a second annular gasket 17.

The columnar body 11 may be a cylindrical columnar body and is provided with a plurality of heat-radiating fins 111, a first through hole 112, a second through hole 113, an LED supporting end 114, and a mounting end 115. The heat-radiating fins 111 are curved in shape to provide increased heat radiating area, and are spaced along an outer circumferential surface of the columnar body 11 to extend between the LED supporting end 114 and the mounting end 115. The first through hole 112 and the second through hole 113 communicate the LED supporting end 114 with the mounting end 115. The mounting end 115 is externally provided with male threads 1151 for convenient mounting or replacement of the LED lamp 1.

The first conducting plate 12 is disposed on a top of the LED supporting end 114 and has a first conducting terminal 121 received in the first through hole 112.

The LED 13 has a first electrode 131 in electric contact with the first conducting plate 12.

The second conducting plate 14 is disposed around the LED 13 to electrically contact with a second electrode 132 of the LED 13, and has a second conducting terminal 141 received in the second through hole 113.

The cap 15 has a rear coupling end 151 and a front end defining a size-reduced central opening 152. The rear coupling end 151 of the cap 15 is covered around the LED supporting end 114 of the columnar body 11, so that the first conducting plate 12, the second conducting plate 14, and the LED 13 are located in the cap 15 with a light-emitting section 133 of the LED 13 enclosed in the central opening 152.

The first annular gasket 16 is disposed between the LED supporting end 114 of the columnar body 11 and the rear coupling end 151 of the cap 15, and the second annular gasket 17 is disposed between the light-emitting section 133 and the central opening 152.

Figure 3:
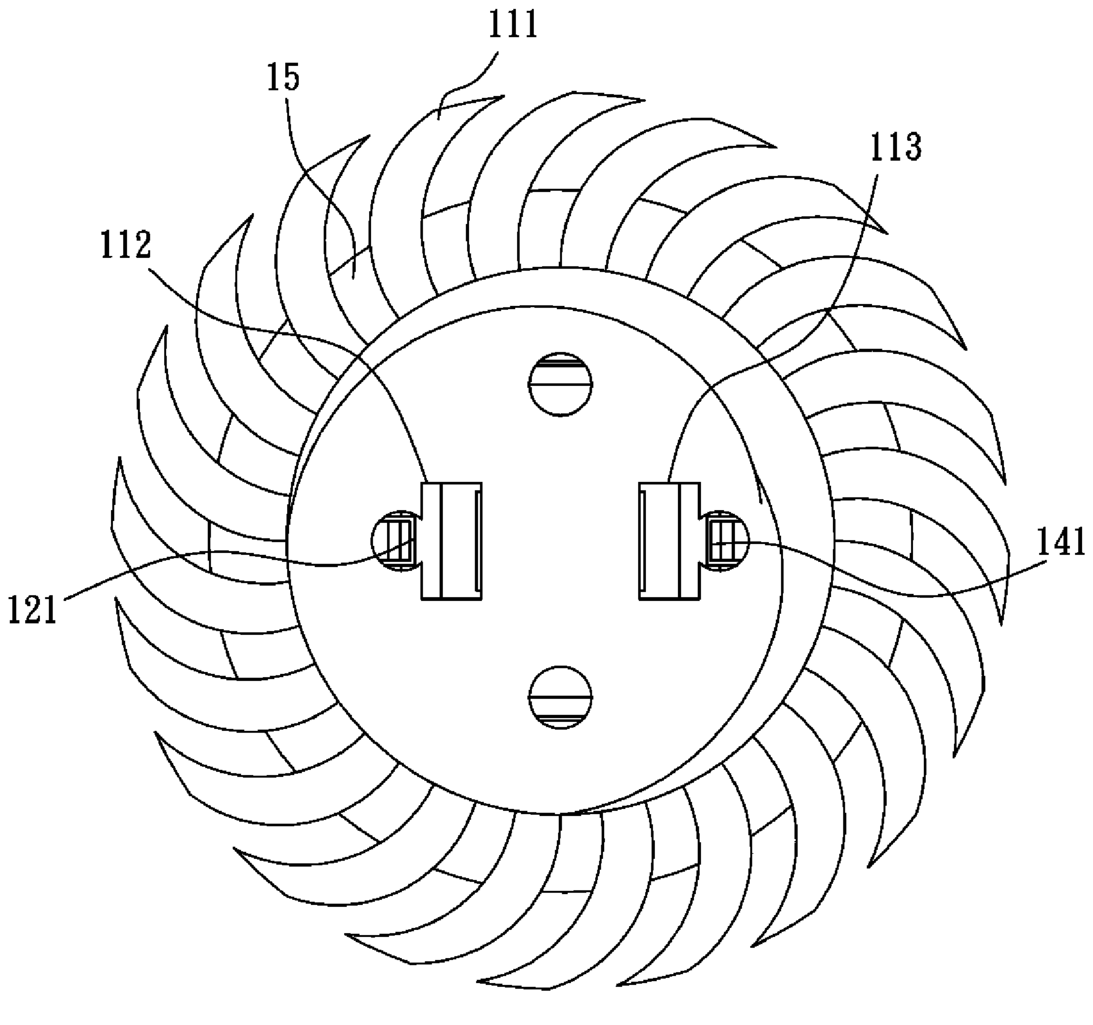
FIG. 3 is a bottom view of the LED lamp of FIG. 1.

FIG. 3 is a bottom view of the LED lamp 1 of the present invention. Please refer to FIGS. 1 and 3 at the same time. As shown, power may be supplied from a power source (not shown) to the LED lamp 1 via two conductors (not shown), which are separately extended from the power source through the first and the second through hole 112, 113 to connected to the first conducting terminal 121 and the second conducting terminal 141, so that the LED 13 is powered to emit light.

Figure 4:
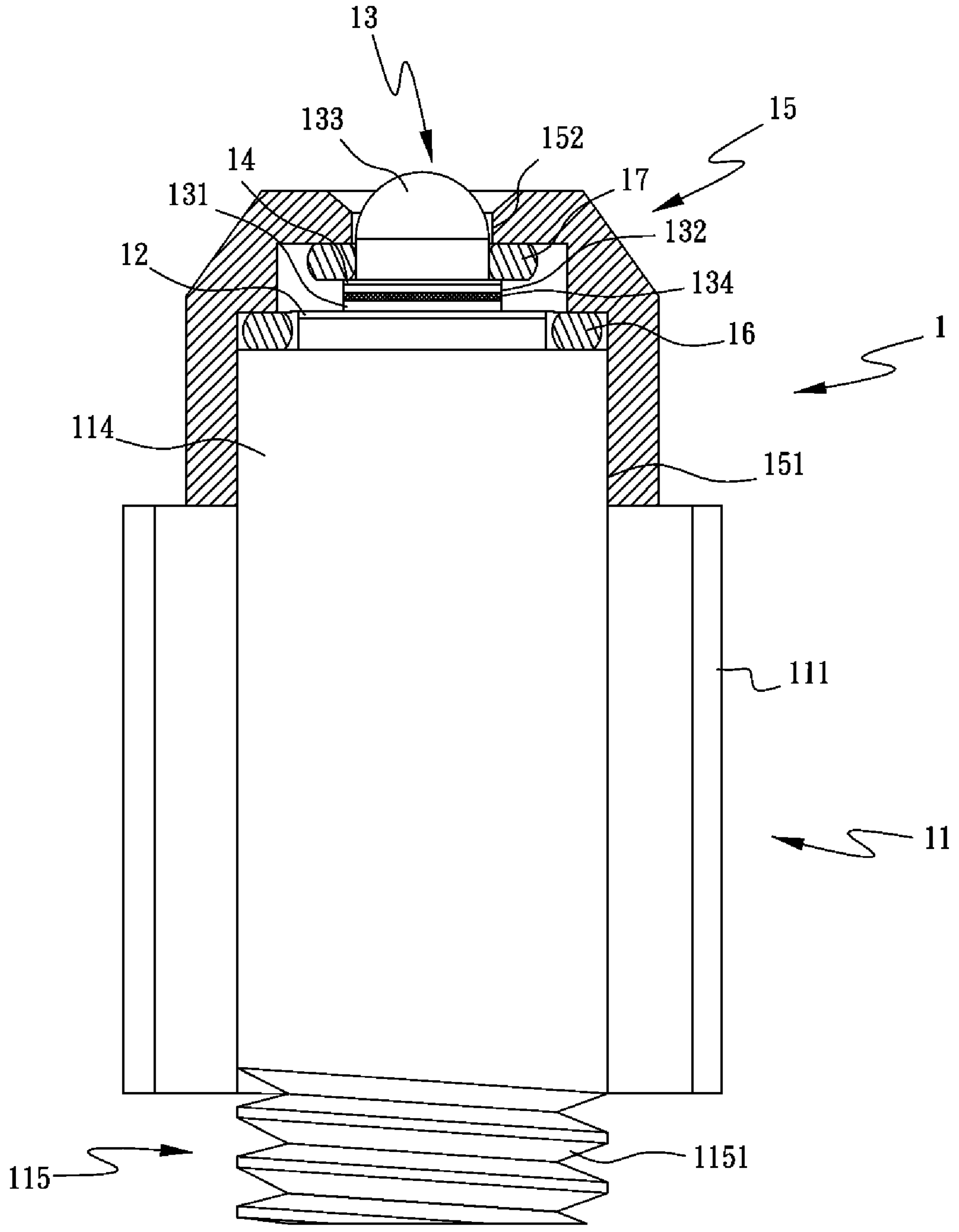
FIG. 4 is longitudinal sectional view of the LED lamp of FIG. 1.

FIG. 4 is a longitudinal sectional view of the LED lamp 1 of the present invention. As shown, in addition to the light-emitting section 133, the first electrode 131, and the second electrode 132, the LED 13 further includes an insulating layer 134 to insulate the first electrode 131 from the second electrode 132. When power is supplied from the power source (not shown) to the first and the second electrode 131, 132, the light-emitting section 133 emits light and produces heat. Part of the produced heat is transferred via the first electrode 131, the first conducting plate 12, and the LED supporting end 114 of columnar body 11 to the heat-radiating fins 111 around the columnar body 11 and dissipates into ambient air; and the other part of the produced heat is transferred via the second electrode 132, the second conducting plate 14, and the LED supporting end 114 of the columnar body 11 to the heat-radiating fins 111 and dissipates into ambient air. As can be found, since the heat produced by the LED 13 during the operation thereof may be transferred to the heat-radiating fins 111 via more than one path in the form of contact transmission, the heat dissipation efficiency of the LED lamp 1 is largely upgraded.

In the event of a damaged LED 13, a user needs only to remove the cap 15 from the LED supporting end 114 of the columnar body 11, replace the damaged LED 13 with a new one, and remount the cap 15 to maintain the LED lamp 1 in the functional state. That is, the LED lamp 1 of the present invention may be easily maintained or repaired.

Further, in the event the LED lamp 1 is splashed with liquid, the first annular gasket 16 functions to seal a joint of the LED supporting end 114 of the columnar body 11 and the rear coupling end 151 of the cap 15, and the second annular gasket 17 functions to seal a joint of the light-emitting section 133 of the LED 13 and the front central opening 152 of the cap 15, preventing the liquid from invading into the cap 15 and the columnar body 11 to cause short circuit of the LED 13.

Figure 5:
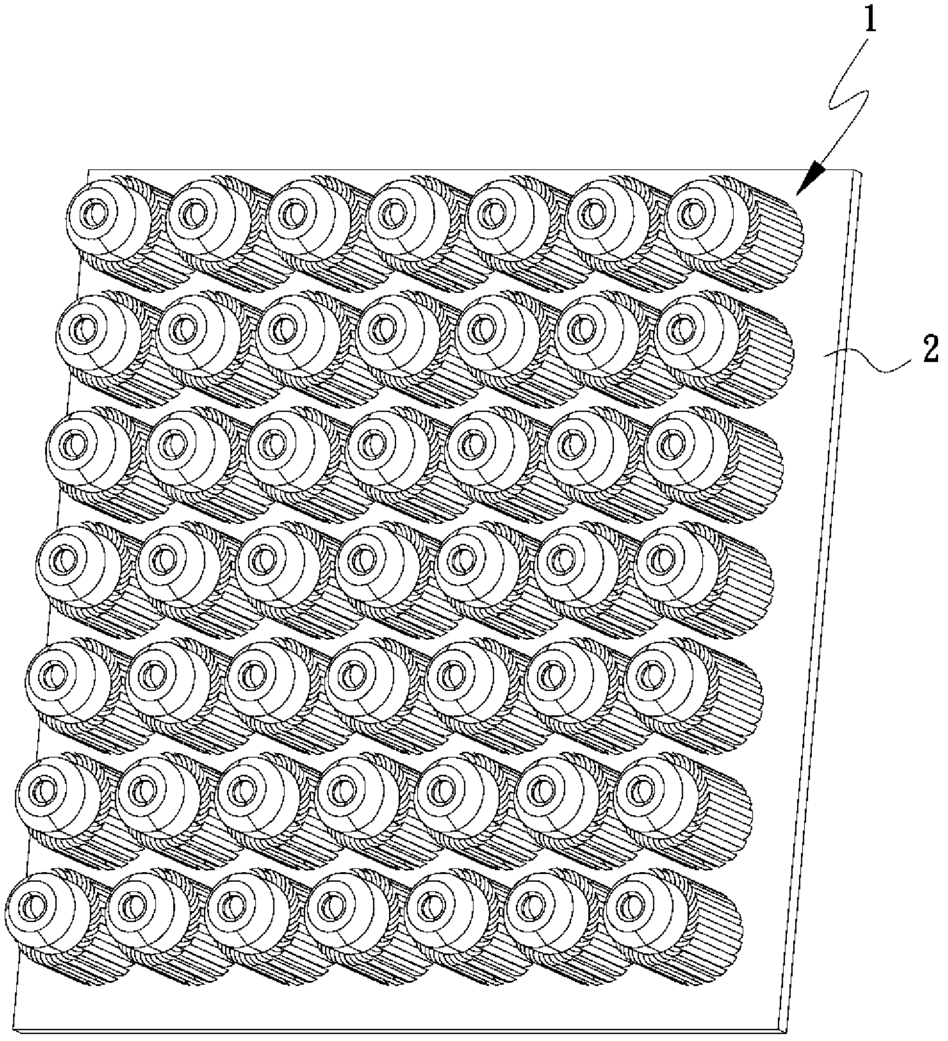
FIG. 5 shows an example of application of the LED lamp of the present invention.

FIG. 5 shows an example of application of the LED lamp 1 of the present invention. As shown, a plurality of the LED lamps 1 may be simultaneously mounted on a panel 2 in different patterns, so as to provide increased brightness while creating a special visual effect. The panel 2 also provides additional heat radiating area and is therefore helpful in dissipating the heat produced by the LED lamp 1 during the operation thereof.

The LED lamp 1 of the present invention is novel and improved because the provision of the annular gaskets and the curved heat-radiating fins on the columnar body makes the LED lamp waterproof and excellent in heat radiation. The LED lamp of the present invention is also industrially useful and practical for use because the waterproof LED lamp with good heat radiation can also be easily maintained or replaced. Therefore, products derived from the LED lamp of the present invention would no doubt meet the current market demands.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A light-emitting diode (LED) lamp, comprising:

a columnar body being provided with a plurality of heat-radiating fins, a first through hole, a second through hole, an LED supporting end, and a mounting end; the heat-radiating fins being spaced along an outer circumferential surface of the columnar body to extend between the LED supporting end and the mounting end, and the first and the second through hole communicating the LED supporting end with the mounting end;

a first conducting plate being disposed on a top of the LED supporting end and having a first conducting terminal received in the first through hole of the columnar body;

an LED having a first electrode, a second electrode, and a light-emitting section; and the first electrode being electrically contacted with the first conducting plate;

a second conducting plate being electrically contacted with the second electrode of the LED, and having a second conducting terminal received in the second through hole of the columnar body;

a cap having a rear coupling end and a front end defining a central opening; the rear coupling end being covered around the LED supporting end of the columnar body, such that the first conducting plate, the second conducting plate, and the LED are located in the cap; and the light-emitting section of the LED being enclosed in the central opening at the front end of the cap;

a first annular gasket being disposed between the LED supporting end of the columnar body and the rear coupling end of the cap; and a second annular gasket being disposed between the light-emitting section of the LED and the central opening of the cap.

2. The LED lamp as claimed in claim 1, wherein the columnar body is a cylindrical columnar body.

3. The LED lamp as claimed in claim 1, wherein the heat-radiating fins are curved in shape.

4. The LED lamp as claimed in claim 2, wherein the heat-radiating fins are curved in shape.

5. The LED lamp as claimed in claim 1, wherein the mounting end of the columnar body is externally provided with male threads.

6. The LED lamp as claimed in claim 4, wherein the mounting end of the columnar body is externally provided with male threads.

* * * * *